United States Patent
Jenkins

(10) Patent No.: US 9,264,211 B1
(45) Date of Patent: Feb. 16, 2016

(54) PRE-DISTORTION FOR A PHASE INTERPOLATOR WITH NONLINEARITY

(71) Applicant: Xilinx, Inc., San Jose, CA (US)

(72) Inventor: Michael O. Jenkins, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/549,197

(22) Filed: Nov. 20, 2014

Related U.S. Application Data

(62) Division of application No. 13/460,527, filed on Apr. 30, 2012, now Pat. No. 8,913,688.

(51) Int. Cl.
- *H04L 7/00* (2006.01)
- *H03L 7/091* (2006.01)
- *H03L 7/081* (2006.01)

(52) U.S. Cl.
CPC .............. *H04L 7/0025* (2013.01); *H03L 7/081* (2013.01); *H03L 7/091* (2013.01); *H04L 7/0087* (2013.01)

(58) Field of Classification Search
CPC ..... H04L 7/0025; H04L 7/0087; H03L 7/081; H03L 7/091
USPC ............................................................ 375/355
See application file for complete search history.

(56) References Cited

U.S. PATENT DOCUMENTS

| | | | |
|---|---|---|---|
| 8,116,418 B2 * | 2/2012 | Chien | 375/373 |
| 2006/0008027 A1 | 1/2006 | Gao et al. | |
| 2008/0137790 A1 | 6/2008 | Cranford et al. | |
| 2008/0164930 A1 * | 7/2008 | Rausch | 327/298 |
| 2010/0148071 A1 | 6/2010 | Shioda | |
| 2010/0264969 A1 * | 10/2010 | Cheung | 327/158 |

OTHER PUBLICATIONS

Specification and drawings for U.S. Appl. No. 13/460,527, filed Apr. 30, 2012, Jenkins.

* cited by examiner

*Primary Examiner* — Tanmay Shah
(74) *Attorney, Agent, or Firm* — W. Eric Webostad; Gerald Chan

(57) ABSTRACT

In an exemplary system, a first sampling circuit is coupled to a clock module to receive values therefrom. A second sampling circuit is coupled to the clock module to receive the values therefrom. The first sampling circuit includes a first converter, a first phase interpolator, and a first sampler. The first converter is coupled to replace the values with first replacement values for input to the first phase interpolator. The second sampling circuit includes a second converter, a second phase interpolator, and a second sampler. The second converter is coupled to replace the values with second replacement values for input to the second phase interpolator.

9 Claims, 11 Drawing Sheets

PRE-DISTORTION FOR A PHASE INTERPOLATOR WITH NONLINEARITY

CROSS-REFERENCE TO RELATED APPLICATION

This application is a divisional of U.S. patent application Ser. No. 13/460,527, filed Apr. 30, 2012.

TECHNICAL FIELD

An embodiment relates to integrated circuit devices ("ICs"). More particularly, an embodiment relates to pre-distortion for a phase interpolator with nonlinearity for an IC.

BACKGROUND

A phase interpolator may have a nonlinear relationship between input and output. Accordingly, output from such a phase interpolator may have distortion introduced due to such nonlinearity.

Accordingly, it would be both desirable and useful to reduce distortion in an output of a phase interpolator due to nonlinearity of such a phase interpolator.

SUMMARY

One or more embodiments generally relate to pre-distortion for a phase interpolator with nonlinearity for an IC.

An embodiment relates generally to a system. In such an embodiment, a first sampling circuit is coupled to a clock module to receive values therefrom. A second sampling circuit is coupled to the clock module to receive the values therefrom. The first sampling circuit includes a first converter, a first phase interpolator, and a first sampler. The first converter is coupled to replace the values with first replacement values for input to the first phase interpolator. The second sampling circuit includes a second converter, a second phase interpolator, and a second sampler. The second converter is coupled to replace the values with second replacement values for input to the second phase interpolator.

An embodiment relates generally to an apparatus. In such an embodiment, a pre-distorter is coupled to receive a first signal. The pre-distorter is configured to convert first values of the first signal into second values for a second signal. The pre-distorter includes a converter for converting the first values to the second values. A phase interpolator is coupled to receive the second signal. The second values are associated with nonlinearity of the phase interpolator. The phase interpolator is configured to provide an interpolated output from the second signal. The second signal is adjusted for the nonlinearity of the phase interpolator by use of the second values.

An embodiment relates generally to a method. In such an embodiment, replacement values are stored in a converter to compensate for nonlinearity of a phase interpolator. The replacement values are for exchanging input clock data recovery values to provide output clock data recovery values. The converter is provided coupled to an input of the phase interpolator. A sampler is provided coupled to an output of the phase interpolator.

BRIEF DESCRIPTION OF THE DRAWINGS

Accompanying drawings show exemplary embodiments. However, the accompanying drawings should not be taken to limit the embodiments shown, but are for explanation and understanding only.

FIG. 2-1 is a flow diagram depicting an exemplary embodiment of a linearization population flow.

FIG. 2-2 is a flow diagram depicting an exemplary embodiment of a pre-distortion flow.

FIGS. 3-1 through 3-5 are graphical diagrams depicting an exemplary embodiment of a generation flow for replacement values corresponding to the linearization population flow of FIG. 2-1.

FIG. 4 is a block diagram depicting an exemplary embodiment of an IC having a center eye sampling circuit and an off-center eye sampling circuit coupled to a clock data recovery ("CDR") module.

FIG. 5 is a block diagram depicting another exemplary embodiment of an IC having the center eye sampling circuit, the off-center eye sampling circuit, and the CDR module of FIG. 4.

DETAILED DESCRIPTION

Figure 1:
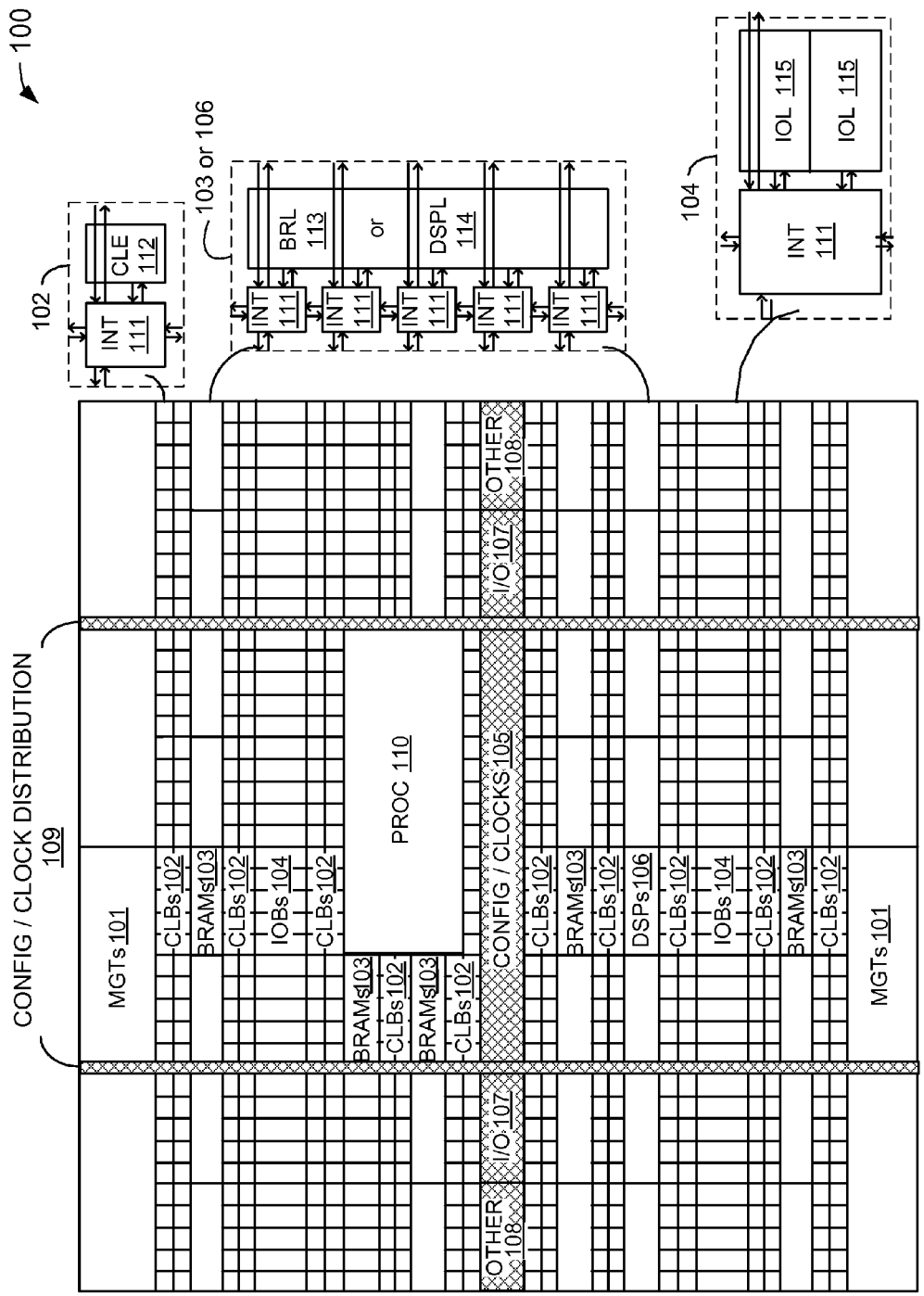
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

A phase interpolator may introduce distortion in an output thereof due to nonlinear behavior of such phase interpolator. If such nonlinear behavior could be understood, then mitigation of such distortion may be implemented.

With the above general understanding borne in mind, various embodiments for determination of pre-distortion replacement values for input to a phase interpolator are generally described below. Such pre-distortion replacement values may be used to replace actual input values to a phase interpolator with corresponding pre-distortion replacement values ("replacement values"). Such replacement values may compensate for nonlinearity of a phase interpolator to reduce the amount of distortion introduced by such phase interpolator. These replacement values may be determined by use of a waveform with a known shape as an input to a phase interpolator. Using a waveform with a known shape allows distortion introduced by a phase interpolator to be determined at discrete values. Along those lines, compensation may be provided by pre-distorting input to a phase interpolator by replacing discrete input values with other values determined to mitigate against nonlinearity of such phase interpolator.

Because one or more of the above-described embodiments are exemplified using a particular type of IC, a detailed description of such an IC is provided below. However, it should be understood that any type of IC may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figures 1, 2:
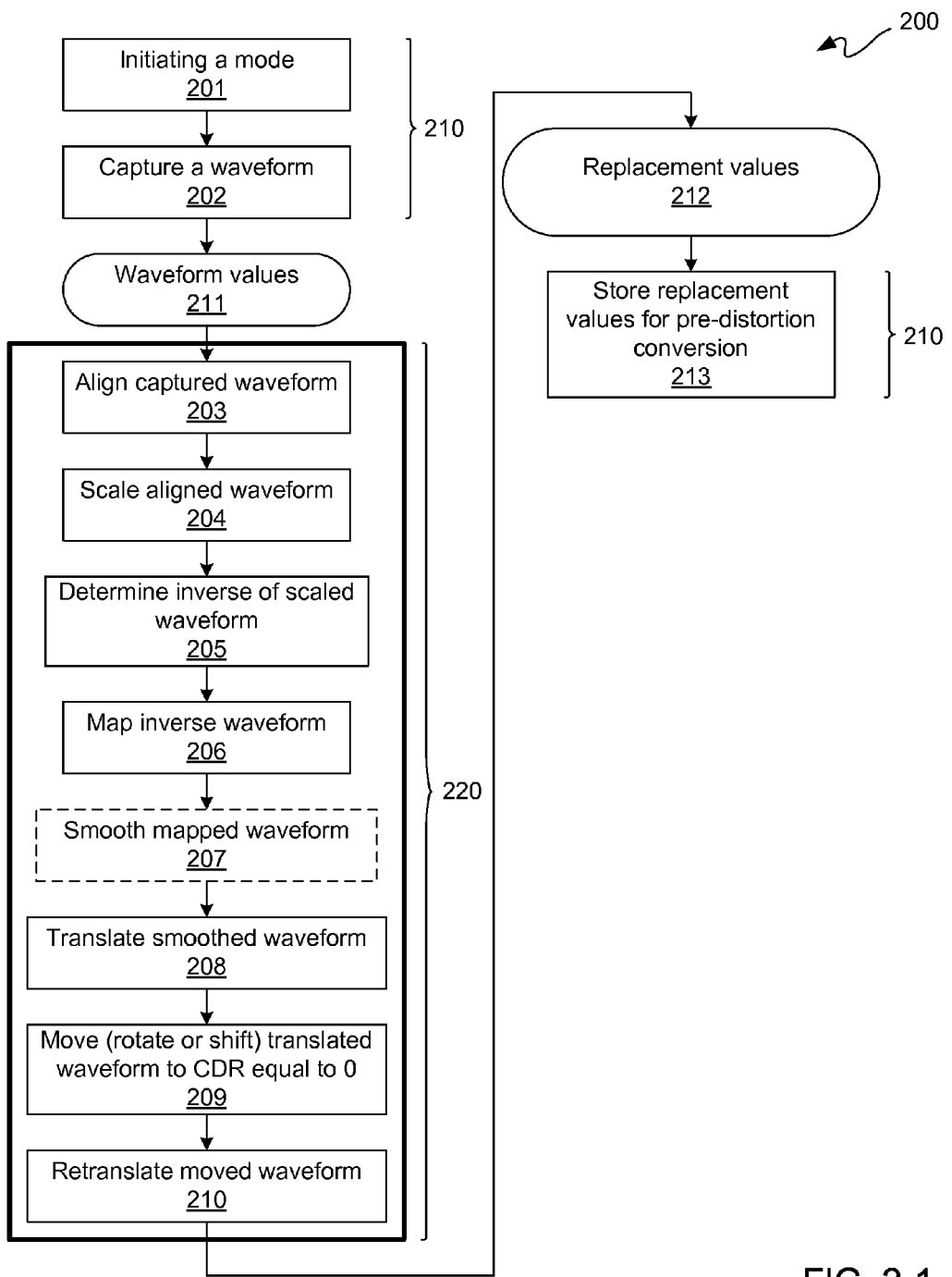
Figure 2:
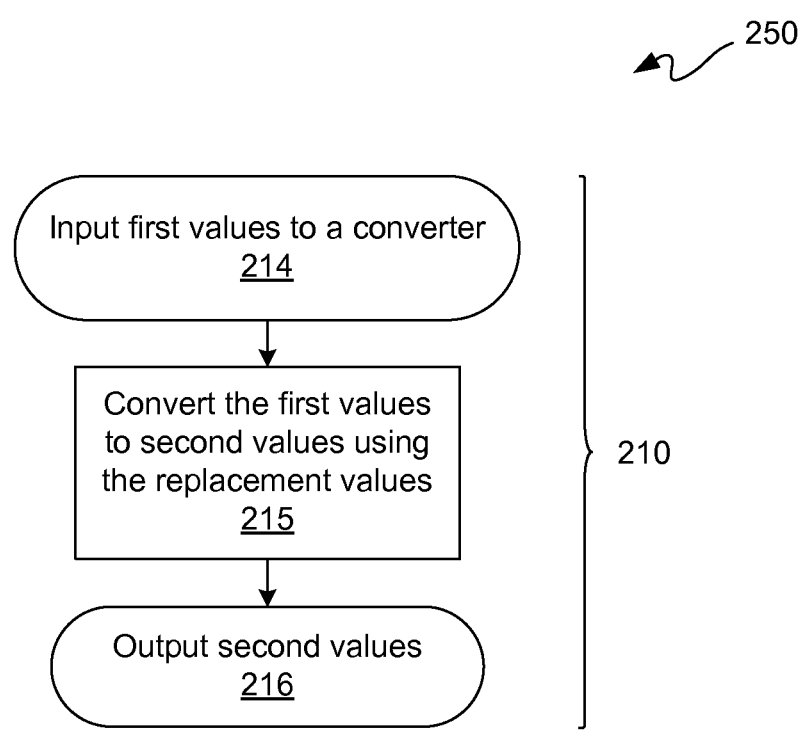

FIG. 2-1 is a flow diagram depicting an exemplary embodiment of a linearization population flow 200. Linearization population flow 200 may be used to populate a table with values to pre-distort an input signal to a phase interpolator, where output of such phase interpolator is nonlinear with respect to input thereof. In other words, such phase interpolator has nonlinear behavior.

At 201, a mode for an IC ("chip") is initiated. Such a mode may be a low power mode ("LPM"). The LPM initiated may have a low amplitude though still sufficient power for capturing the waveform of a signal ("waveform"). If a waveform is driven in a normal or higher power mode through a semiconductor circuit, more distortion may be introduced than if an LPM is used. For example, dynamic range of an integrated circuit amplifier is limited, and an LPM may be used to conservatively operate within such dynamic range so as to reduce the amount of distortion introduced. Along those lines, a "cleaner" waveform may be obtained; provided, however, there is sufficient power for capture of such waveform. Even though use of a LPM is described, it should be understood that in other embodiments, other power modes may be used, including without limitation a specified or targeted power range of operation of an integrated circuit amplifier, a normal power mode, or a high power mode.

At 202, a waveform of a chip is captured. A captured waveform may be represented as a list of time-value points, such as (t1, y1), (t2, y2), . . . , (tn, yn), for n a positive integer associated with a discrete number of samples or sampling points. The number of points, n, may be limited by a range of a phase interpolator. Such capture may include sampling such waveform with a sampler of such chip. Such capture may be a discrete capture, namely a capture of discrete values. For purposes of clarity by way of example not limitation, such captured waveform is described as being a digital sinusoidal waveform; however, in other embodiments, other types of piecewise invertible waveforms may be used, such as for example triangular waveforms and impulses, among others. More particularly, for purposes of clarity by way of example and not limitation, a sampler used to capture such waveform may be a binary sampler, namely output of such binary sampler may effectively be a list of zeroes and ones.

Operations at 201 and 202 may be on-chip operations 210 for providing an off-chip output of waveform values 211. In an embodiment, each waveform value 211 may be provided as a number of samples taken for a point, and how many of those samples taken for that point were logic ones. In another embodiment, each such waveform value 211 may be a number of samples taken for point, and how many of those samples taken were logic zeros. In yet another embodiment, each such waveform value 211 may be how many samples taken for a point were logic ones, and how many samples taken for such a point were logic zeros.

At 203, a captured waveform is aligned. Such captured waveform may be aligned for a best fit to a sine wave or other waveform. Such waveform values 211 may be for one-cycle or one-period of such a sine wave or other waveform. However, in other embodiments more or less than one-cycle may be used.

At 204, an aligned captured waveform is scaled. The scaling may be for normalization of such waveform. Such scaling may be to +/−1, namely generally to make A sin (2πft) appear as just the coefficient A for amplitude.

Operations 203 through 210 may be off-chip operations. In an embodiment, a general-purpose computer may be programmed with software to provide a special-purpose computer for performing replacement values generation operations ("off-chip operations") 220. A chip used to provide waveform values 211 may be coupled to or be part of a computer system for providing off-chip operations 220.

At 205, an inverse of a waveform scaled at 204 is determined. For the example embodiment of a sinusoidal waveform, an arcsine or $\sin^{-1}$ of such sinusoidal waveform is determined at 205.

At 206, an inverse waveform is mapped onto a range, such as mapping a range of degrees for a waveform to a range of unit intervals ("UIs"). Such arcsine may be piecewise extracted. In other words, an arcsine is only defined from −90 degrees to 90 degrees. Accordingly, to cover a cycle or period from 0 to 360 degrees for example, pieces of the arcsine are extracted and mapped to other locations to piecewise cover a cycle. Along those lines, for example, 0 to 90 degrees may be mapped to 0 to 0.5 UIs.

Optionally, at 207, such mapped inverse waveform may be smoothed to avoid and/or reduce impact of discontinuities and/or to simplify mathematical processing. In an embodiment, a sliding scale may be used to determine weighted averages of points along such mapped waveform. For purposes of clarity by way of example and not limitation, it shall be assumed that such mapped inverse waveform is smoothed at 207. Such smoothing or filtering of such mapping result may be to enhance monotonicity.

At 208, such smoothed inverse waveform is translated. This translation may be to a UI equal to zero horizontal axis with respect to propagation of a waveform in time. In other words, UI values associated with a phase interpolator output, namely phase time in UIs, may be subtracted from such smoothed waveform to translate such smoothed waveform generally to a horizontal axis, where such horizontal axis represents a phase interpolator input equal to zero.

A phase interpolator input is generally a clock signal, which may be a clock data recovered signal. Such a clock signal may be represented as a sequence of points associated with time and amplitude to provide a phase and time output.

At 209, a translated inverse waveform may be shifted or rotated for alignment to a zero starting location. A sequence of points input to a phase interpolator may be rotated or shifted along a propagation of time axis such that a zero rising is the beginning of a waveform. However, such zero rising location may or may not be an actual location where a clock data recovery ("CDR") value is zero of such translated waveform. For example, a CDR value equal to zero may be in a middle region of a signal eye. Thus, at 209, such translated inverse waveform may be shifted to align a zero rising point to a CDR equal to 0 location.

At 210, such inverse waveform may be retranslated. For example, subtraction of UI values used at 208 may be added back. In effect, translation at 208 may be a subtraction of time, and retranslation at 210 may be an adding back of the time previously subtracted. Such retranslated inverse waveform represents a phase linearity error of a phase interpolator.

At 212, replacement values obtained from such retranslated inverse waveform may be output. Such replacement values may be discrete values for exchanging CDR values, such as for exchanging actual CDR values with corresponding replacement values.

At 213, replacement values output at 212 may be stored in storage of a chip. Along those lines, storage at 213 is an on-chip operation 210. Such replacement values may be stored in a table or other converter. Such table may associate "ideal" CDR values with corresponding replacement values. By "ideal" CDR values, it is generally meant values that would be used but for nonlinearity of a phase interpolator. Thus, for purposes of example and not limitation, CDR values may be from 0 to 63 to represent one-half of a cycle of a sinusoidal signal; the other one-half of a cycle of a sinusoid signal may be represented reusing such 64 values due to symmetry of a sinusoid. However, in other embodiments, an entire cycle may be tabularized.

FIG. 2-2 is a flow diagram depicting an exemplary embodiment of a pre-distortion flow 250. Operations 214 through 216 of pre-distortion flow 250 may be on-chip operations 210.

As previously described with reference to FIG. 2-1, replacement values may be stored at 213 in a converter or pre-distorter to compensate for nonlinearity of a phase interpolator. At 214, first values of a signal are input to such converter. At 215, such converter converts or exchanges such first values for second values using such replacement values. For purposes of clarity by way of example and not limitation, replacement values may be used to exchange actual clock data recovery recovered values with corresponding replacement values. At 216, such second values may be output from such converter for input as a second signal to a phase interpolator. Such second values are a pre-distortion of such first values to compensate for or mitigate against nonlinearity of such phase interpolator.

FIGS. 3-1 through 3-5 are graphical diagrams depicting an exemplary embodiment of a generation flow 300 for replacement values corresponding to linearization population flow 200 of FIG. 2-1. Horizontal axis 310 is propagation time in terms of UIs, and vertical axis 320 is phase time in terms of UIs. With simultaneous reference to FIGS. 2-1 and 3-1 through 3-5, generation flow 300 is further described.

Figures 1, 3:
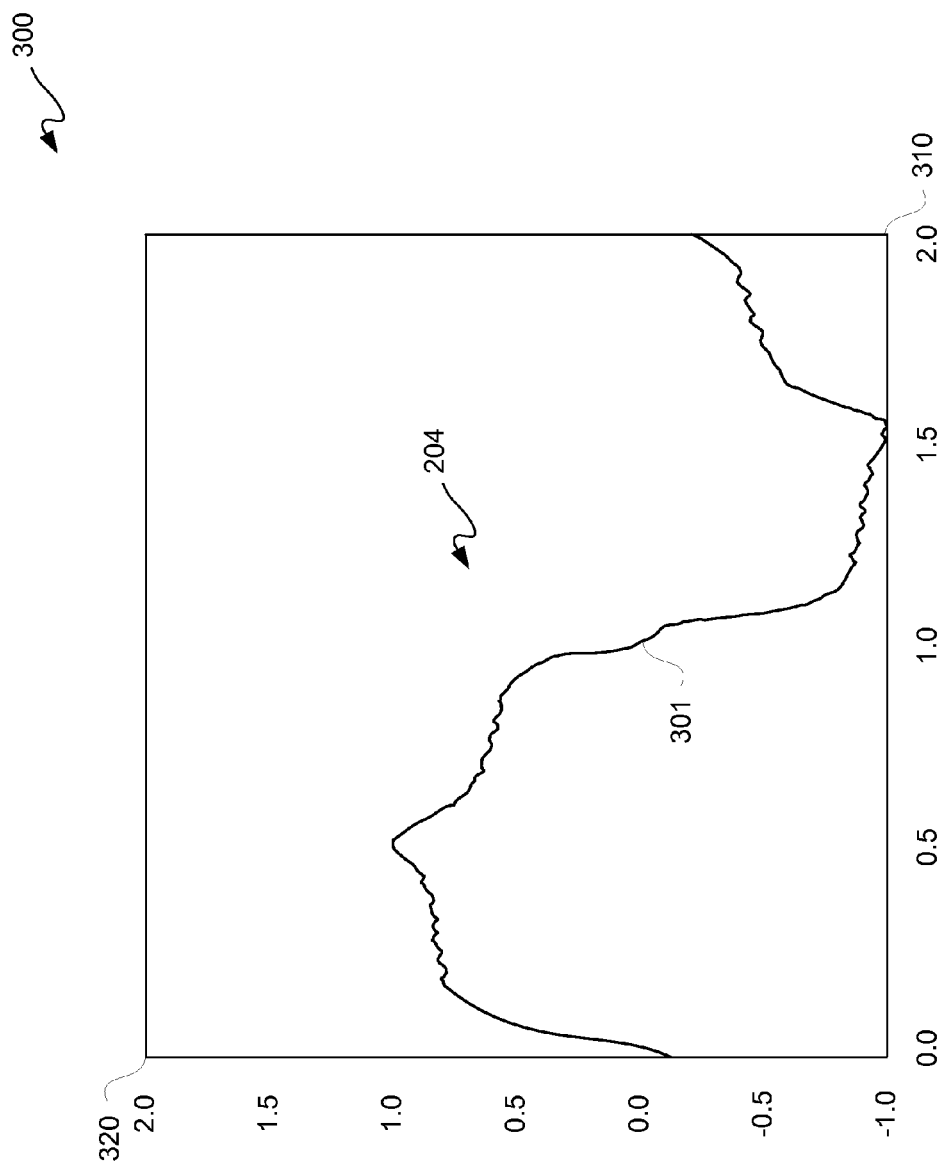
Figures 2, 3:
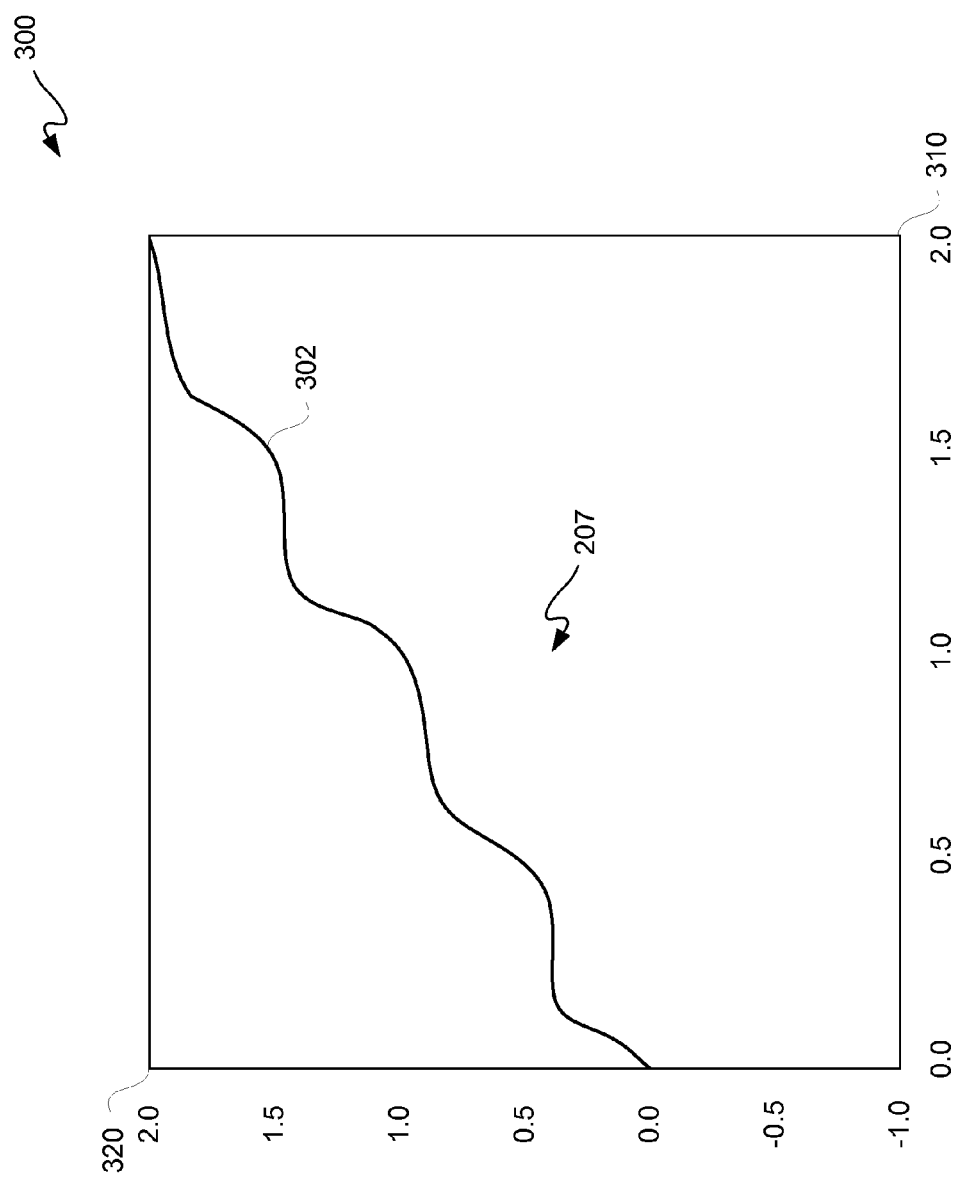
Figure 3:
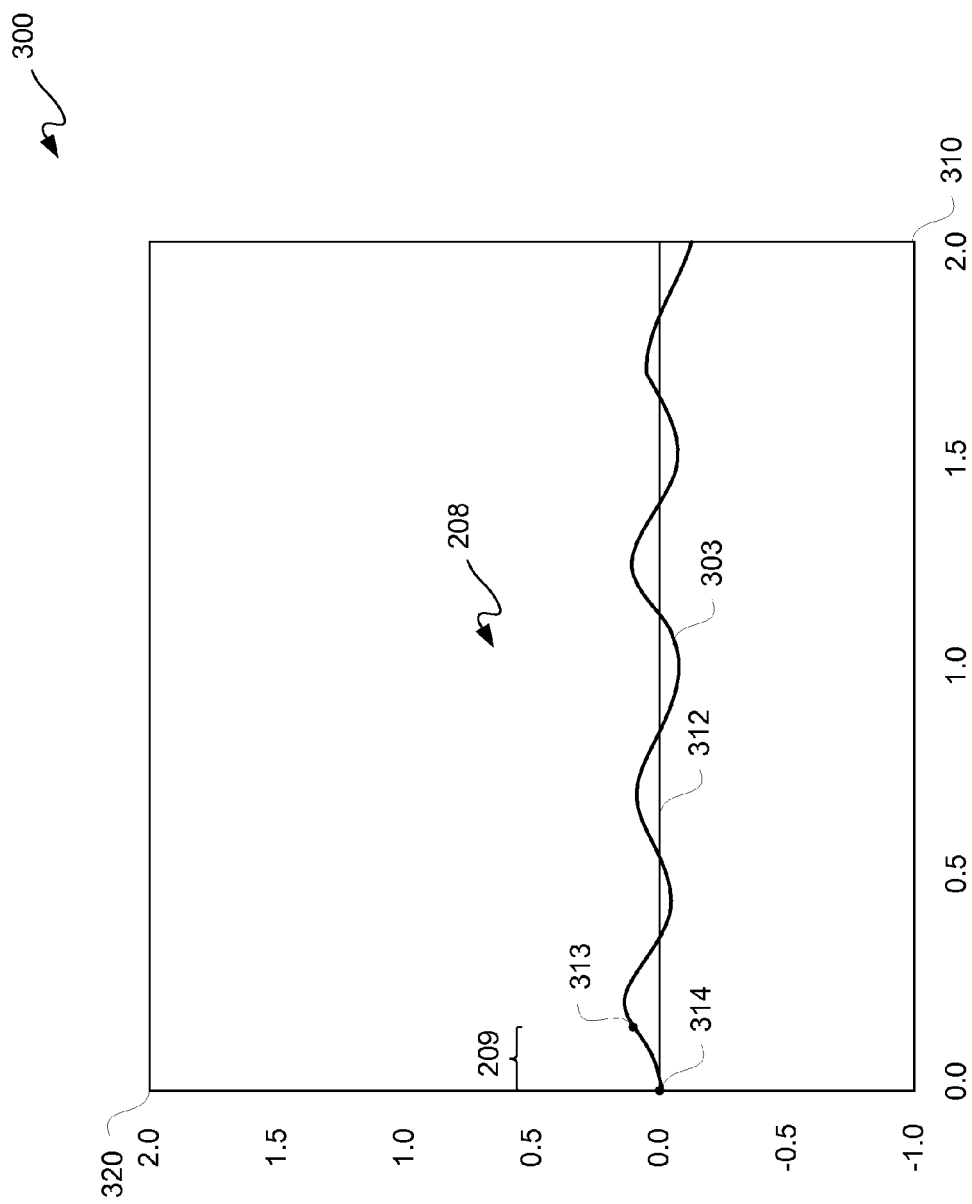

With reference to FIG. 3-1, waveform 301 may be generated from waveform values 211. Waveform 301 is an imperfect sinusoid; however, due to nonlinearity of a phase interpolator, waveform 301 is a significantly distorted imperfect sinusoid. Waveform 301 may be a waveform after scaling at 204 for preparation for inversion at 205.

With reference to FIG. 3-2, waveform 302 is an inverse waveform of waveform 301. As waveform 301 in this example is a sinusoid, waveform 302 is inverted by taking an arcsine of waveform 301. If waveform 301 were a perfect or ideal sinusoid, then waveform 302 would be a straight line. Waveform 302 may be a smoothed inverted waveform at 207.

With reference to FIG. 3-3, waveform 303 is a version of waveform 302 translated to a horizontal axis 312. Horizontal axis 312 may be a zero axis, namely for representing input to a phase interpolator equal to zero. Thus, phase time in UIs may be subtracted from waveform 302 to provide waveform 303.

A zero rising point 314 may be used for initial orientation for waveform 303. However, such zero rising location may not be an actual location where a CDR value is zero of such translated waveform, namely point 313. Accordingly, at 209, as previously described, such translated inverse waveform 303 may be shifted to align a zero rising point 314 to a CDR value equal to 0 point 313.

Figures 3, 4:
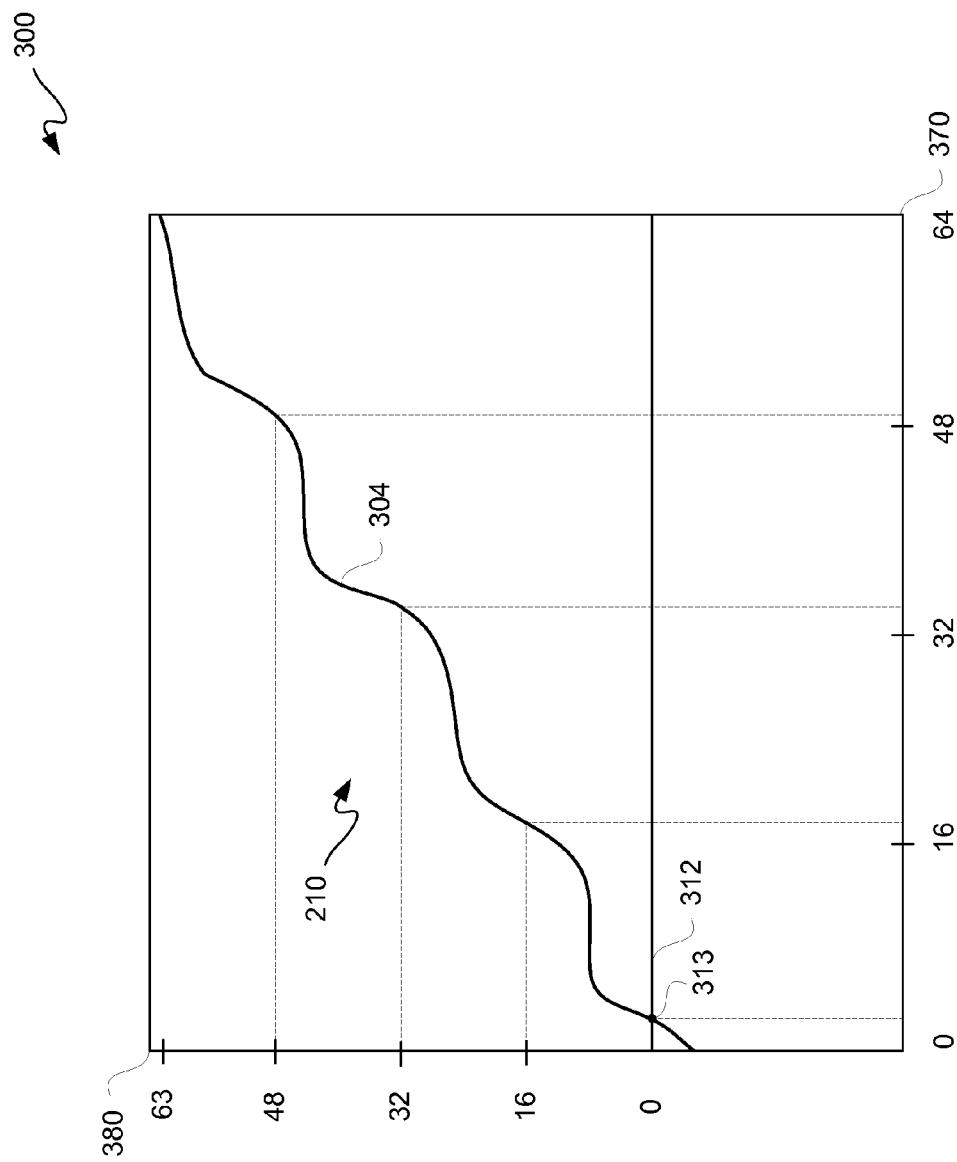

With reference to FIG. 3-4, waveform 304 is a retranslated version of waveform 303. Axis 370 is the same as axis 310, except CDR equivalent values are used. Likewise, axis 380 is the same as axis 320, except CDR equivalent values are used. Phase time in UIs are added to waveform 303 to provide waveform 304. In other words, waveform 303 is retranslated away from axis 312 to provide waveform 304. Waveform 303 in this exemplary embodiment was moved such that point 313 is at a CDR input value equal to zero. By such translation, waveform 304 may be used to provide replacement values as described below in additional detail.

Axis 380 represents first or input CDR values, and axis 370 represents second or output CDR values. Even though CDR values are used for purposes of clarity by way of example and not limitation, other types of codes for a clock or other signal with phase may be used.

CDR values are input referencing axis 380, and where those values intersect waveform 304 indicate corresponding CDR values intersecting along axis 312, as indicated on axis 370. If for example, for this exemplary embodiment, CDR values of 0, 16, 32, and 48 are input, then corresponding CDR values of approximately 2.5, 17.6, 34.0, and 48.8 are output. Such output CDR values may be input to a phase interpolator as replacements for such input CDR values.

Figures 3, 4, 5:
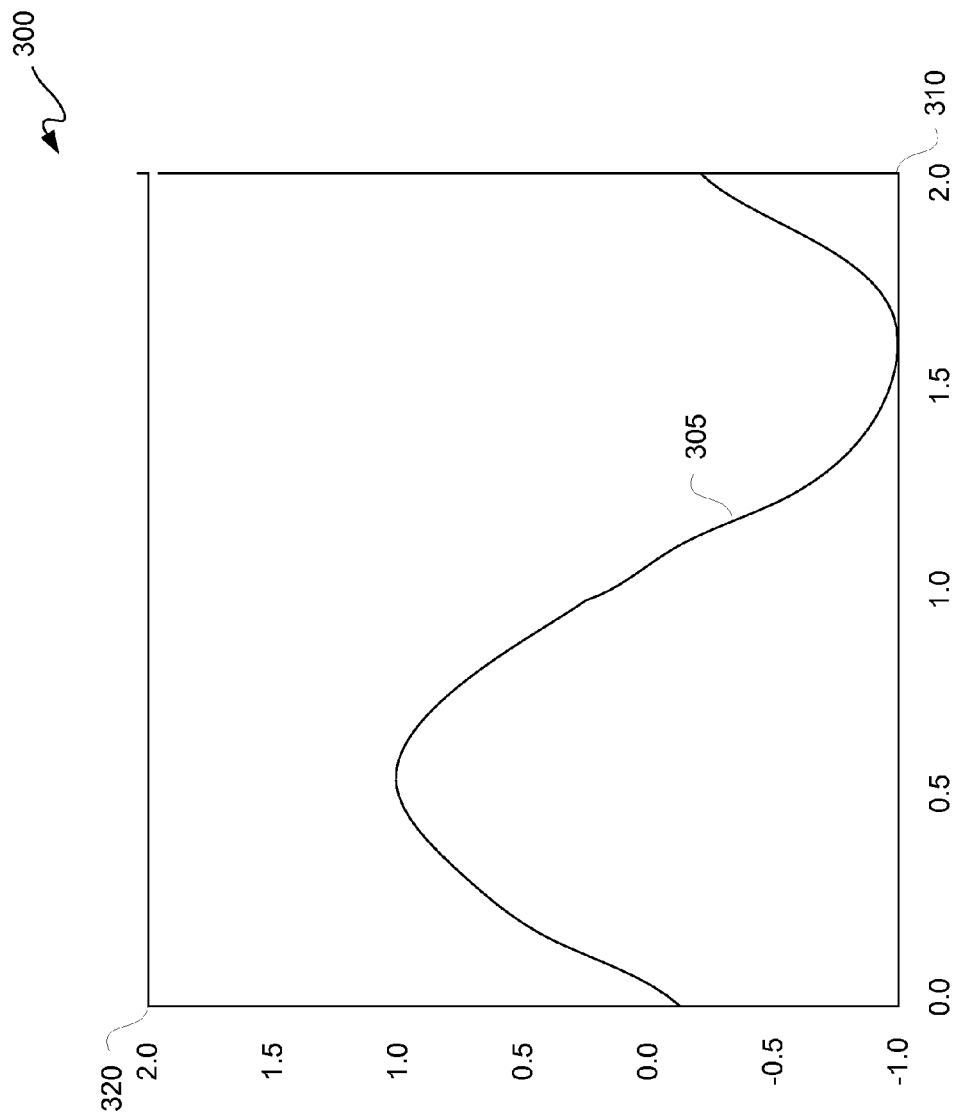
Figure 4:
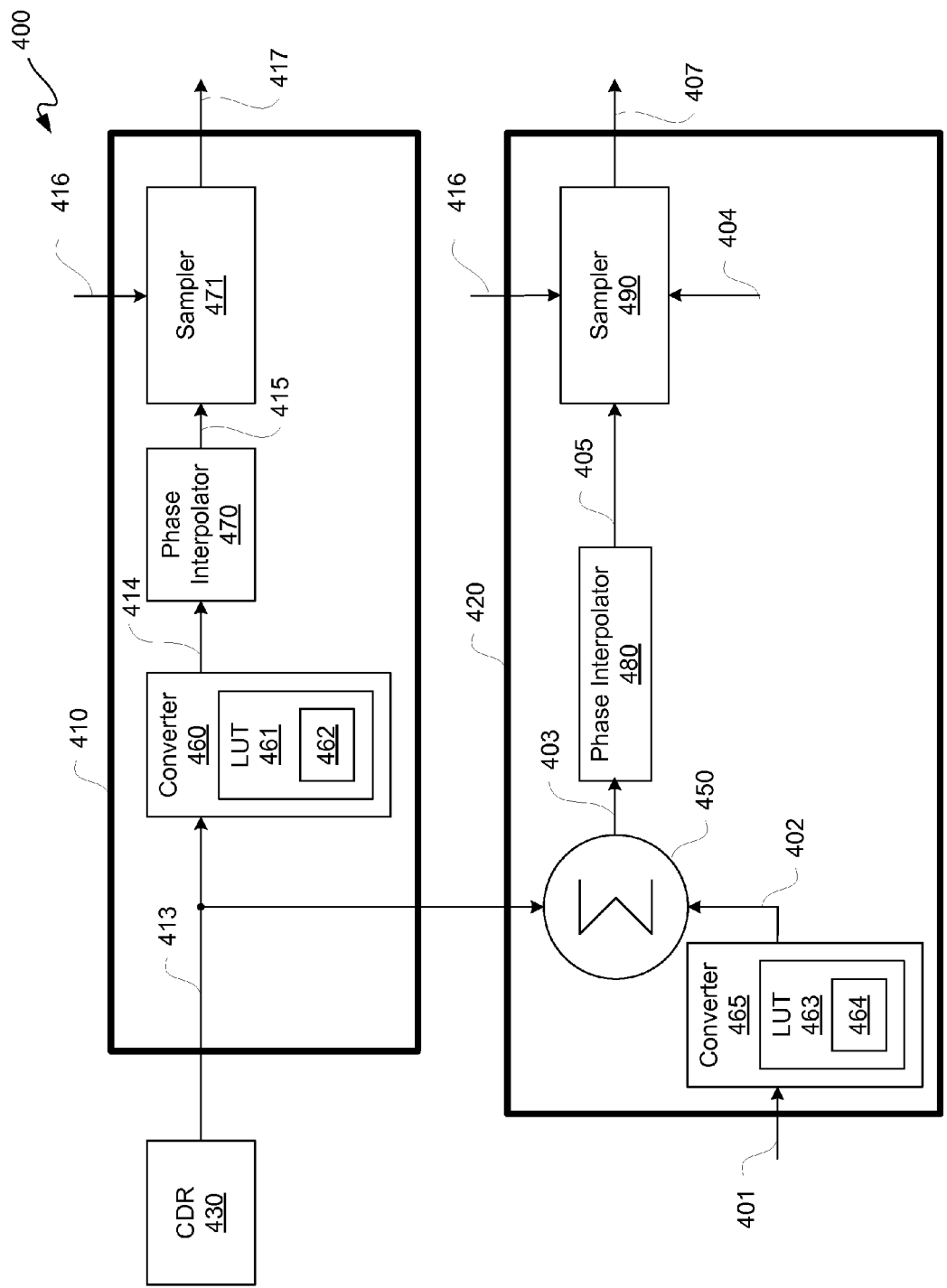
Figure 5:
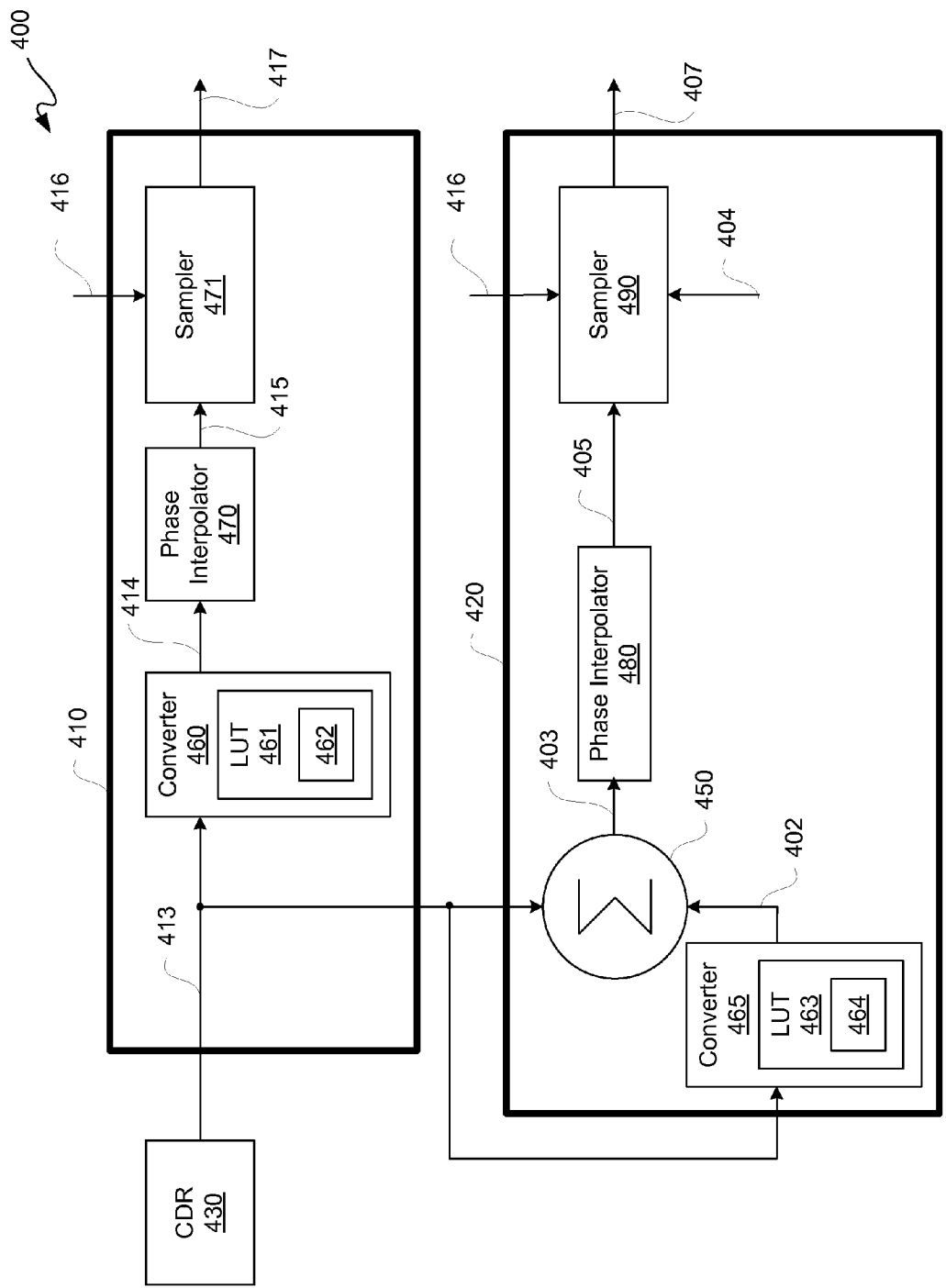

With reference to FIG. 3-5, waveform 305 is an example of a sinusoidal output of a phase interpolator by using replacement CDR values. Continuing the above example, rather than using actual CDR input values, such as CDR values of 0, 16, 32, and 48 for example, for input to a phase interpolator, replacement CDR input values, such as corresponding CDR values of approximately 2.5, 17.6, 34.0, and 48.8 for example, are provided as input to such phase interpolator to produce a waveform 305 from such phase interpolator. Therefore, by pre-distorting CDR values input to a phase interpolator to compensate for nonlinearity thereof, a more linear output signal may be obtained. In other words, for example, rather than obtaining a distorted waveform 301, as an output from sampling, a less distorted waveform 305 may be obtained.

FIG. 4 is a block diagram depicting an exemplary embodiment of a chip 400 having a center eye sampling circuit 410 and an off-center eye sampling circuit 420 coupled to a clock module 430. Chip 400 may be an FPGA, such as FPGA 100 for example. Clock module 430 provides a clock signal 413. For purposes of clarity by way of example and not limitation, clock module 430 may be a CDR module 430 for providing a CDR clock output 413 to each of center eye sampling circuit 410 and off-center eye sampling circuit 420.

A converter or pre-distorter 460 of center eye sampling circuit 410 is coupled to receive CDR clock signal 413 output from CDR module 430. Center eye sampling circuit 410 includes pre-distorter 460, phase interpolator 470, and sampler 471. Sampler 471 may be a binary sampler, and pre-distorter 460 may include a look-up table 461. Look-up table may be formed using memory or other circuitry. Look-up table 461 may have stored therein replacement values 462. Replacement values 462 may be associated with nonlinearity of phase interpolator 470 as previously described. Replacement values 462 may be CDR replacement values in association with or for association with a set of CDR values, such as previously described herein.

Converter 460 may obtain CDR values from CDR clock signal 413 for conversion into or exchange with replacement CDR values using replacement values 462 of look-up table ("LUT") 461 to provide pre-distorted CDR clock signal 414. Continuing the above example, replacement values 462 may be for a sinusoidal signal. However, replacement values 462 may be for any type of piecewise invertible waveform, as previously described.

Replacement values 462 may be completely exchanged with actual values. However, in another embodiment, replacement values 462 may be differences between an input CDR value and an output CDR value to be provided therefor. In such an embodiment, converter 460 may include adder and/or subtractor circuitry for providing output CDR values based on input CDR values and adjustment differences respectively therefor. For purposes of clarity and not limitation, it shall be assumed that whole replacement values and not difference replacement values are used.

Phase interpolator 470 is coupled to receive pre-distorted CDR clock signal and configured to provide a phase interpolated signal 415. Phase interpolated signal 415 is made more linear, namely adjusted for nonlinearity of phase interpolator 470, by pre-distortion of input thereto as previously described herein. Even though single in-phase interpolation is described, other types of signals may be used, including without limitation quadrature phase signals.

Sampler 471, which may be a binary sampler, is coupled to receive an input data signal 416 and phase interpolated signal 415. Input data signal 416 may be demodulated or otherwise recovered data associated with CDR clock signal 413. Accordingly, sampling of input data signal 416 is controlled by phase interpolated signal 415, namely controlled by clock phase information provided in such signal. Input data signal 416 may for example be a sinusoidal waveform or other type of data signal. Output of sampler 471 is sampled data signal 417, which is a modulated signal by such sampling.

Eye diagrams may be used to determine characteristics such as pulse shaping and channel distortion, among other characteristics, of a modulated signal. Eye diagrams are well known, and thus are not described in unnecessary detail herein. However, it should be understood that if phases are not sufficiently accurately matched for data sampling, bit error rate ("BER") during sampling may be sufficiently high to have a significant adverse effect on signal-to-noise ratio ("SNR"), data recovery accuracy, and/or other performance indicators. Accordingly, by pre-distorting CDR values input to phase interpolator 470 to compensate for nonlinearity of such phase interpolator 470, a better eye may be obtained. Along those lines, performance may be improved.

With continuing reference to FIG. 4, chip 400 may have an off-center eye sampling circuit 420 coupled to CDR module 430. Off-center eye sampling circuit 400 may include converter 465, a combiner circuit 450, phase interpolator 480, and sampler 490. Converter 465 may be the same as converter 460, namely for example having a LUT 463 with replacement values 464.

Off-center sampling circuit 400 may be used for determining replacement values for a waveform associated with non-linearity of phase interpolator 480, as previously described. If it is assumed nonlinearity of phase interpolator 480 is approximately the same as nonlinearity of phase interpolator 470, replacement values 462 and 464 may be equivalent.

Converter 465 may be coupled to receive coded signal 401. Coded signal 401 may be on-chip or off-chip provided codes to sweep across a range to produce a waveform for a "statistical eye." By "statistical eye," it is generally meant a representation, such as a plot for example, indicating a bit error ratio ("BER") versus position for a signal sampled at positions within a range of times and a range of amplitudes. For example, a general-purpose computer may be programmed with the software to provide a special-purpose computer to produce codes of coded signal 401. Such special-purpose computer may be coupled to chip 400, as previously described herein.

Output of converter 465 may be a horizontal offset signal 402. For example, replacement values of a LUT of converter 465 may be used for exchange with or conversion of coded values of coded signal 401 to provide a horizontal offset signal 402, for reasons as previously described herein. In such an embodiment, horizontal offset signal 402 may include differences to be added to CDR values of CDR clock signal 413 for producing pre-distorted CDR clock signal 403. By adding or added, it is generally meant to include addition of either or both positive to positive values or positive to negative values. Horizontal offset signal 402 may be provided as an input to combiner circuit 450 to combine with CDR clock signal 403. For purposes of clarity by way of example and not limitation, combiner circuit 450 is illustratively depicted as a summer 450. Even though a summer 450 is illustratively depicted for purposes of clarity by way of example, any circuitry that outputs a pre-distorted signal as described herein to compensate for non-linearity of a phase interpolator may be used. Additionally, CDR module 430 may provide CDR clock signal 413 to summer 450. Sums of codes or code values of CDR clock signal 413 and associated with replaced code values of horizontal offset signal 402 may be provided as a pre-distorted CDR clock signal 403 output from summer 450. Pre-distorted CDR clock signal 403 may be provided as an input to phase interpolator 480. Output of phase interpolator 480 may be phase interpolated signal 405.

An input to sampler 490 may be phase interpolated signal 405. Optionally, another input to sampler 490 may be vertical offset signal 404. Another input to sampler 490 may be input data signal 416, as previously described. Sampler 490 may be a binary sampler or other type of sampler.

Sampling of input data signal 416 by sampler 490 is controlled by phase interpolated signal 405, namely controlled by clock phase information provided by interpolated signal 405. Again, input data signal 416 may for example be a sinusoidal waveform or other type of data signal. Output of sampler 490 is sampled data signal 407, which is a modulated signal by such sampling.

FIG. 5 is a block diagram depicting another exemplary embodiment of a chip 400 having a center eye sampling circuit 410 and an off-center eye sampling circuit 420 coupled to a CDR module 430. However, in this exemplary embodiment, rather than feeding coded signal 401 as an input to converter 465, CDR clock signal 413 is provided as input to both converter 465 and summer 450. This assumes that nonlinearity of phase interpolator 470 is approximately the same as that of phase interpolator 480. This exemplary embodiment of chip 400 is otherwise the same as that previously described with reference to FIG. 4, and accordingly such description is not repeated.

Figure 6:
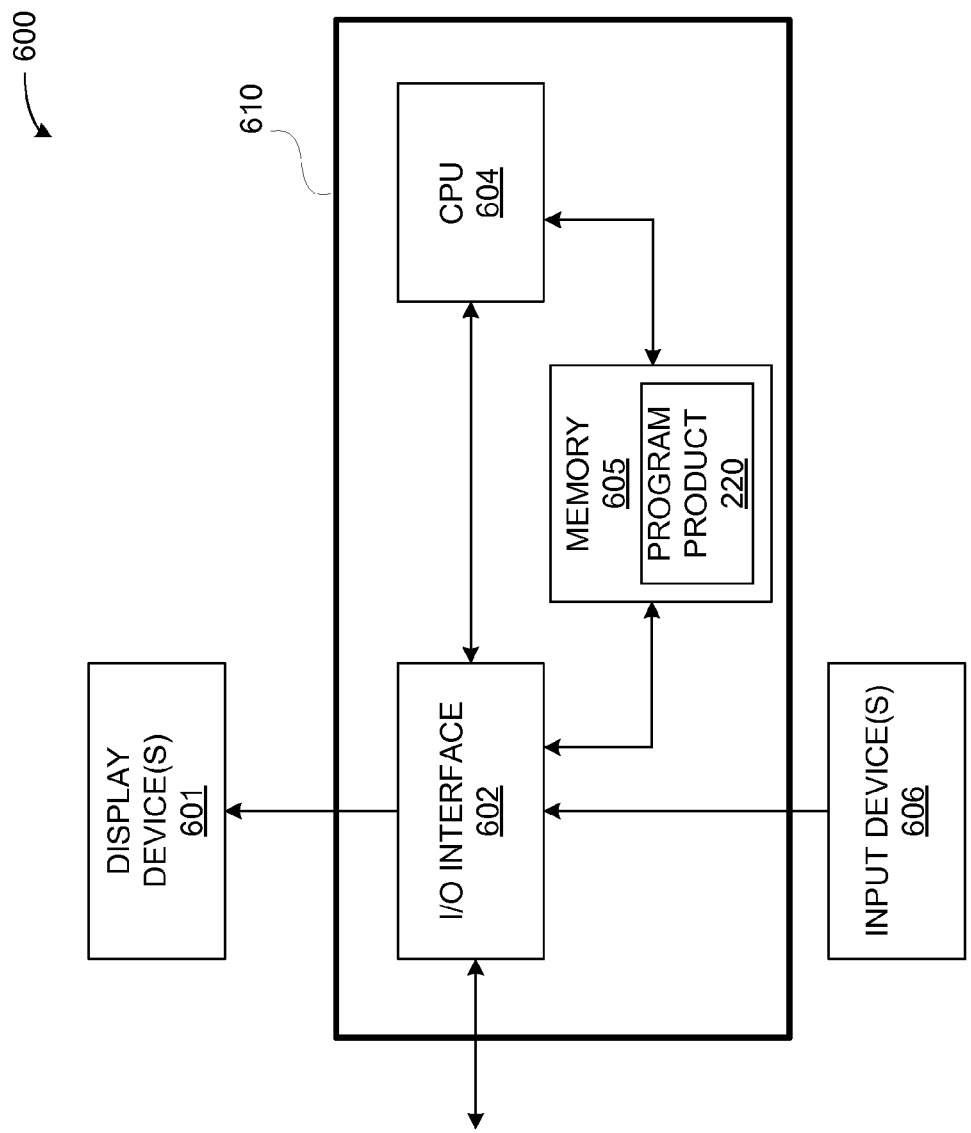
FIG. 6 is a block diagram depicting an exemplary embodiment of a computer system.

FIG. 6 is a block diagram depicting an exemplary embodiment of a computer system 600. Computer system 600 may include a programmed computer 610 coupled to one or more display devices 601, such as Cathode Ray Tube ("CRT") displays, plasma displays, Liquid Crystal Displays ("LCD"), projectors and to one or more input devices 606, such as a keyboard and a cursor pointing device. Other known configurations of a computer system may be used.

Programmed computer 610 may be programmed with a known operating system, which may be Mac OS, Java Virtual Machine, Real-Time OS Linux, Solaris, Unix, or a Windows operating system, among other known platforms. Programmed computer 610 includes a central processing unit (CPU) 604, memory 605, and an input/output ("I/O") interface 602. CPU 604 may be a type of microprocessor known in the art, such as available from IBM, Intel, ARM, and Advanced Micro Devices for example. Support circuits (not shown) may include cache, power supplies, clock circuits, data registers, and the like. Memory 605 may be directly coupled to CPU 604 or coupled through I/O interface 602. At least a portion of an operating system may be disposed in memory 605. Memory 605 may include one or more of the following: random access memory, read only memory, magneto-resistive read/write memory, optical read/write memory, cache memory, magnetic read/write memory, and the like, as well as non-transitory signal-bearing media as described below.

I/O interface 602 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 602 may be coupled to a conventional keyboard, network, mouse, display printer, and interface circuitry adapted to receive and transmit data, such as data files and the like. Programmed computer 610 may be coupled to a number of client computers, server computers, or any combination thereof via a conventional network infrastructure, such as a company's Intranet and/or the Internet, for example, allowing distributed use for interface generation.

Memory 605 may store all or portions of one or more programs or data to implement processes in accordance with one or more embodiments hereof to provide off-chip operations ("program product") 220. Additionally, those skilled in the art will appreciate that one or more embodiments hereof may be implemented in hardware, software, or a combination of hardware and software. Such implementations may include a number of processors or processor cores independently executing various programs and dedicated hardware or programmable hardware.

One or more program(s) of the program product 220, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). The above embodiments specifically include information downloaded from the Internet and other networks. Such non-transitory signal-bearing media, when carrying computer-readable instructions that direct functions hereof, represent embodiments hereof.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. A system, comprising:
 a clock module;
 a first sampling circuit coupled to the clock module to receive first values therefrom;
 a second sampling circuit coupled to the clock module to receive second values therefrom;
 wherein the first sampling circuit includes a first converter, a first phase interpolator, and a first sampler;
 wherein the first converter is coupled to replace the first values with first replacement values for input to the first phase interpolator;
 wherein the second sampling circuit includes a second converter, a second phase interpolator, and a second sampler; and
 wherein the second converter is coupled to replace the second values with second replacement values for input to the second phase interpolator;
 wherein the second sampler further includes:
  a combiner circuit coupled to receive the second values and an offset signal;
  the offset signal is output from the second converter and includes the second replacement values;
  the second converter is coupled to receive the second values to provide the second replacement values therefor; and
  the combiner circuit is configured to combine the second values and the second replacement values to output a pre-distorted clock signal for input to the second phase interpolator.

2. A system, comprising:
 a clock module;
 a first sampling circuit coupled to the clock module to receive first values therefrom;
 a second sampling circuit coupled to the clock module to receive second values therefrom;
 wherein the first sampling circuit includes a first converter, a first phase interpolator, and a first sampler;
 wherein the first converter is coupled to replace the first values with first replacement values for input to the first phase interpolator;
 wherein the second sampling circuit includes a second converter, a second phase interpolator, and a second sampler; and
 wherein the second converter is coupled to replace the second values with second replacement values for input to the second phase interpolator;
 wherein the second sampler further includes:
  a combiner circuit coupled to receive the second values and an offset signal;
  the offset signal is output from the second converter and includes the second replacement values;
  the second converter is coupled to receive a coded signal to sweep across a range to provide the second replacement values therefor; and
  the combiner circuit is configured to combine the second values and the second replacement values to output a pre-distorted clock signal for input to the second phase interpolator.

3. The system according to claim 2, wherein the range is used to produce a waveform for a statistical eye.

4. The system according to claim 1, wherein:
 the clock module is a clock data recovery module; and
 the values are clock data recovery signal values.

5. The system according to claim 1, wherein:
 the first sampling circuit is a center eye sampling circuit; and
 the second sampling circuit is an off-center eye sampling circuit.

6. The system according to claim 1, wherein the first replacement values are same as the second replacement values.

7. The system according to claim 2, wherein:
 the clock module is a clock data recovery module; and
 the values are clock data recovery signal values.

8. The system according to claim 2, wherein:
 the first sampling circuit is a center eye sampling circuit; and
 the second sampling circuit is an off-center eye sampling circuit.

9. The system according to claim 2, wherein the first replacement values are same as the second replacement values.

* * * * *